(12) United States Patent
Worones et al.

(10) Patent No.: US 7,830,135 B2
(45) Date of Patent: Nov. 9, 2010

(54) DIGITAL MULTIMETER HAVING HOUSING SEALING ARRANGEMENT

(75) Inventors: Jeffrey E. Worones, Seattle, WA (US); Terry G. Morey, Renton, WA (US)

(73) Assignee: Fluke Corporation, Everett, WA (US)

( * ) Notice: Subject to any disclaimer, the term of this patent is extended or adjusted under 35 U.S.C. 154(b) by 373 days.

(21) Appl. No.: 11/893,093

(22) Filed: Aug. 14, 2007

(65) Prior Publication Data

US 2009/0045805 A1     Feb. 19, 2009

(51) Int. Cl.
    *G01R 1/04* (2006.01)
(52) U.S. Cl. ........................................ 324/156
(58) Field of Classification Search ............... 324/72.5, 324/99 D, 103 R, 103 P, 110, 114, 115, 116, 324/122, 127, 128, 133, 144, 149, 156; 361/728, 361/679.01; 396/25, 29
    See application file for complete search history.

(56) References Cited

U.S. PATENT DOCUMENTS

| | | | |
|---|---|---|---|
| 4,951,834 A | | 8/1990 | Aikins |
| 5,084,670 A | * | 1/1992 | Melenotte ................... 324/156 |
| 5,294,988 A | * | 3/1994 | Wakabayashi et al. ...... 348/373 |
| 5,550,324 A | | 8/1996 | Black et al. |
| 6,043,640 A | | 3/2000 | Lauby et al. |
| 6,466,003 B1 | | 10/2002 | Gallavan et al. |
| 7,034,517 B2 | | 4/2006 | Newcombe |

FOREIGN PATENT DOCUMENTS

| | | |
|---|---|---|
| DE | 4125324 | 2/1993 |
| EP | 0791850 A3 | 2/1998 |
| EP | 1096759 A1 | 5/2001 |
| GB | 2115614 | 9/1983 |
| JP | 2006-268548 A | 9/1994 |
| JP | 406268548 * | 9/1994 |
| WO | 9941531 | 8/1999 |

OTHER PUBLICATIONS

Search Report of U.K. Patent Office dated Jan. 8, 2009, corresponding Great Britain Patent Application No. GB0808364.4, Filed May 8, 2008.
Fluke Users Manual—Model 187 & 189 True RMS Multimeter, Aug. 2002, Rev. 2, Jun. 2002.
Pending U.S. Appl. No. 11/893,109, filed Aug. 14, 2007.
Pending U.S. Appl. No. 11/893,122, filed Aug. 14, 2007.
Pending U.S. Appl. No. 11/893,092, filed Aug. 14, 2007.
Pending U.S. Appl. No. 11/977,078, filed Oct. 23, 2007.
Search Report under Section 17(5) of the UK Intellectual Property Office dated Sep. 9, 2008, corresponding UK application serial No. GB0808364.4 filed May 8, 2008.

* cited by examiner

*Primary Examiner*—Kenneth J Whittington
(74) *Attorney, Agent, or Firm*—Nelson Mullins Riley & Scarborough LLP

(57) ABSTRACT

A multimeter comprises a housing structure including a case defining an interior cavity in which components of the multimeter are located. The case has a shell of rigid polymeric material defining at least one groove containing a softer polymeric material. In addition, the housing structure further includes at least one rigid panel element juxtaposed to the case. The panel element has an elongate bead on an inside surface thereof in alignment with the groove such that the elongate bead presses into the softer polymeric material to provide a seal.

16 Claims, 7 Drawing Sheets

DIGITAL MULTIMETER HAVING HOUSING SEALING ARRANGEMENT

BACKGROUND OF THE INVENTION

The present invention relates generally to digital multimeters. More particularly, the invention relates to a digital multimeter having an improved arrangement for sealing predetermined portions of the housing.

Digital multimeters (DMMs) function to measure a number of parameters generally needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary selector knob by which various functions are selected. A plurality of lead jacks are provided in the case (i.e., housing) of the unit for connection of test leads. The specific jack used may depend on the function that has been selected. An LCD display provides a reading of the tested parameter.

The traditional DMM housing has top and bottom case halves which are joined together to define an interior cavity. At least one of the case halves is typically formed of a rigid polymeric material overmolded with a softer polymeric material to provide a gripping surface. Sometimes, the softer polymeric material has been formed to define a "rib" extending around the periphery of one case half. When the two case halves are brought together, this rib comes into contact with a rigid surface on the other case half, causing the rib to deform, or "crush." Often, this type of crushed rib arrangement has provided an effective environmental seal for the multimeter housing. In some applications, however, a crushed rib type of seal might be less effective.

Details regarding the construction and operation of multimeters may be discerned from U.S. Pat. Nos. 7,034,517, 6,466,003 and 6,043,640, incorporated herein by reference.

SUMMARY OF THE INVENTION

According to one aspect, the present invention provides a multimeter comprising a housing structure including a case defining an interior cavity in which components of the multimeter are located. The case has a shell of rigid polymeric material defining at least one groove containing a softer polymeric material. In addition, the housing structure further includes at least one rigid panel element juxtaposed to the case. The panel element has an elongate bead on an inside surface thereof in alignment with the groove such that the elongate bead presses into the softer polymeric material to provide a seal.

In accordance with some exemplary embodiments, the shell of the case is partially covered by the softer polymeric material to provide an exterior gripping surface. The softer polymeric material of the gripping surface and the softer polymeric material in the grove may be interconnected by a flow channel containing the softer polymeric material.

In some embodiments, the rigid panel element may comprise a separate front panel juxtaposed to a top portion of the case. The front panel may define substantially parallel first and second beads extending adjacent to respective lateral sides thereof. In addition, the case may define a panel recess in a top portion thereof for receipt of the front panel. The panel recess in such embodiments has substantially parallel first and second grooves filled with the softer polymeric material. In addition, the front panel may include an arcuate bead extending around a mounting boss depending from the inside surface thereof. The case in such embodiments defines a corresponding arcuate groove in the panel recess containing the softer polymeric material.

In some embodiments, the rigid panel element may comprise a battery compartment door. The battery compartment door preferably has a perimeter bead pressing against the softer polymeric material in a perimeter groove defined about at least a portion of a periphery of a battery compartment in the case.

Often, it will be desirable to form the case of top and bottom case members which together define the interior cavity. In such embodiments, the rigid polymeric material of the top case member may be a transparent polymeric material. The rigid polymeric material of the bottom case member may be opaque polymeric material.

According to another aspect, the present invention provides a housing structure for a hand-held electronic device. The housing structure comprises a plurality of separate elements joined together including a shell of rigid polymeric material at least partially covered by a softer polymeric material to provide an exterior gripping surface. In such embodiments, the shell defines at least one groove containing a softer polymeric material. A second separate element mates with the shell and has an elongate bead on an inside surface thereof. The groove is in alignment with the elongate bead such that the elongate bead presses into the softer polymeric material to provide a seal.

An additional aspect of the present invention provides a multimeter comprising a housing structure including a case defining an interior cavity in which components of the multimeter are located. The case has a shell of rigid polymeric material. The housing structure further includes at least one rigid panel element juxtaposed to the case. A sealing arrangement is also provided, wherein either the case or panel element defines at least one groove containing a softer polymeric material. The other of the case or panel element has an elongate bead aligned with the groove. The elongate bead presses into the softer polymeric material to provide a seal.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
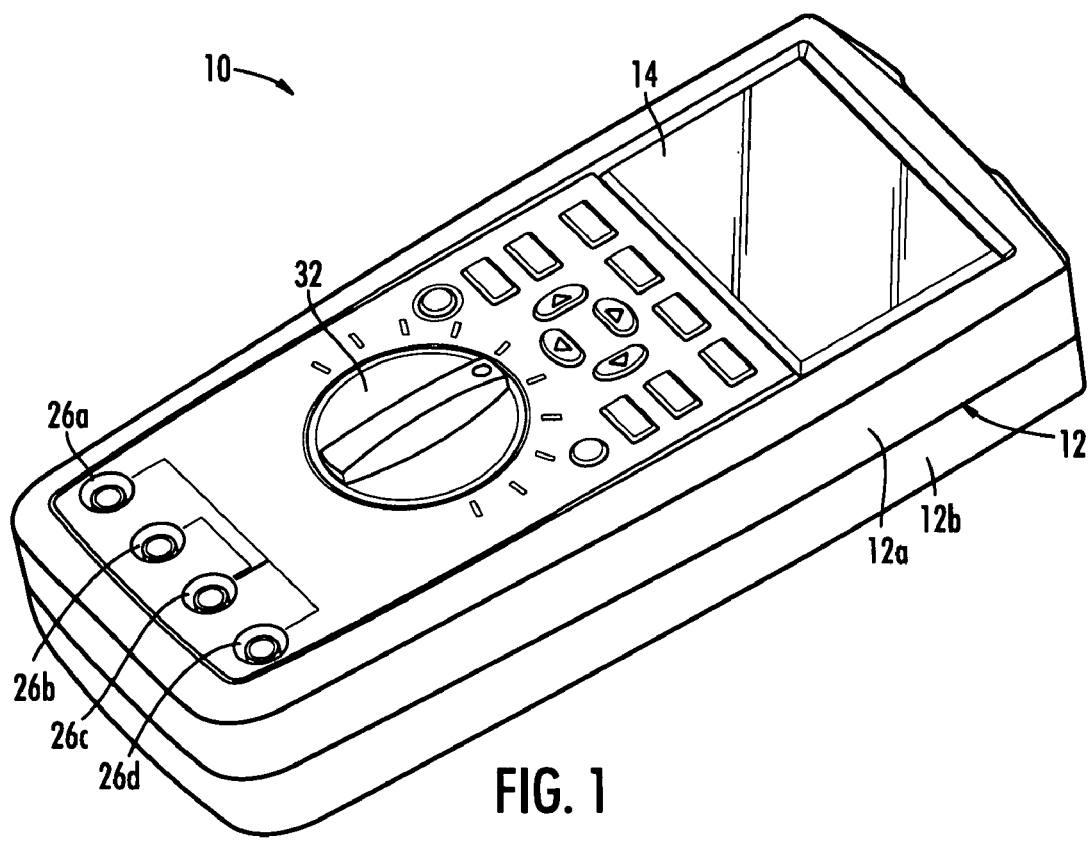
FIG. 1 is a perspective view of a digital multimeter constructed in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with the present invention. Multimeter 10 comprises a housing having a case 12 defining an interior cavity in which various internal components are located. In this embodiment, case 12 is preferably formed having top and bottom case members 12a and 12b which together define the interior cavity. Preferably, each of the case members 12a and 12b may be formed of a molded shell of high impact rigid plastic which is at least partially overmolded with a softer polymeric material.

The softer material provides a desirable gripping surface. The molded shell of the bottom case member may be opaque, whereas embodiments are contemplated in which the molded shell of the top case member is transparent. The transparent material provides a window 14 through which a suitable display, such as a liquid crystal display (LCD), can be viewed.

Figure 2:
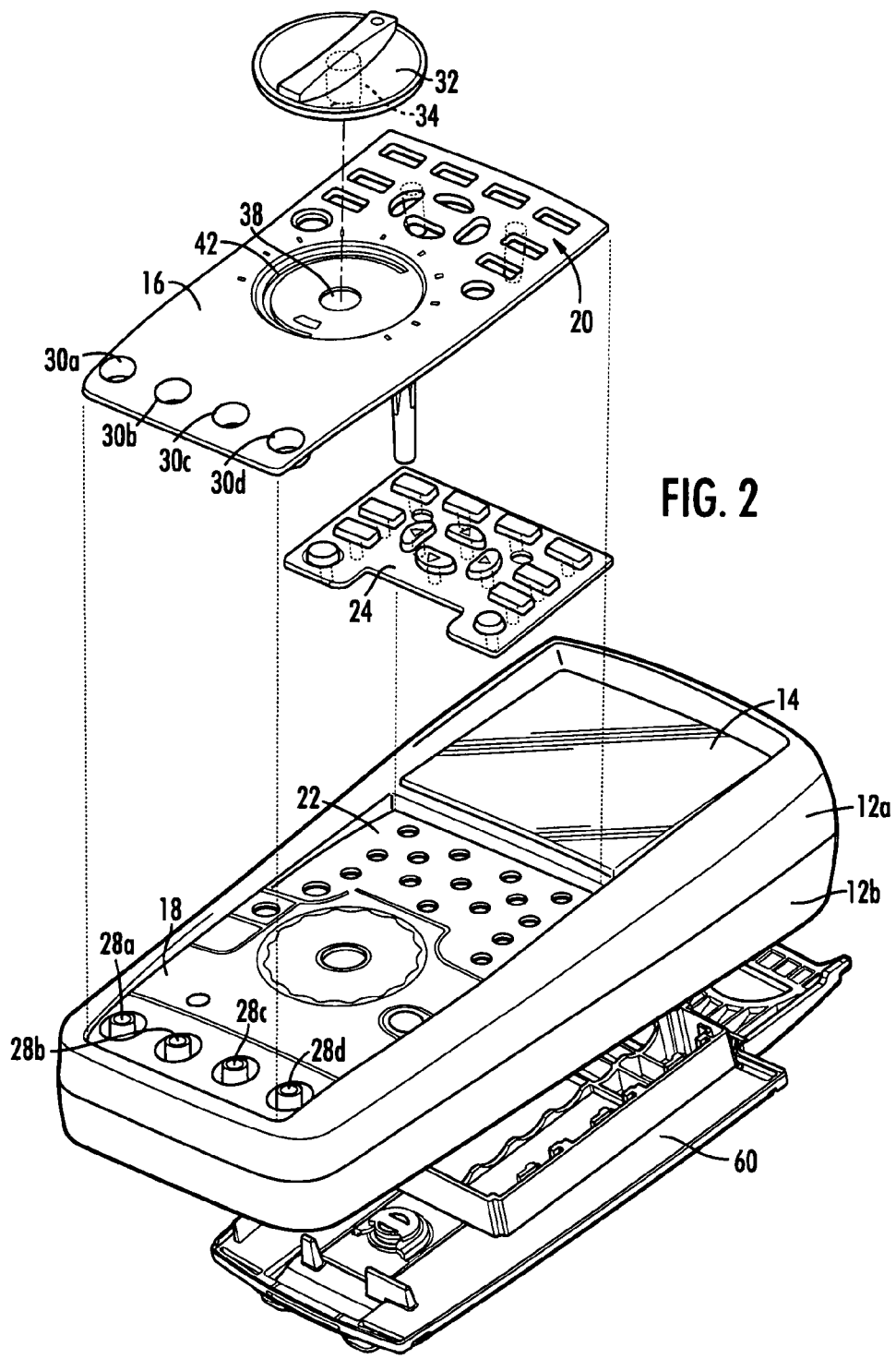
FIG. 2 is perspective view showing certain parts separated from the case for purposes of illustration.

Referring now also to FIG. 2, a separate front panel (or "skin") 16 is received in a corresponding recess 18 defined in case member 12a. Panel 16, which is preferably formed of a rigid polymeric material, defines various apertures and other features necessary for a particular multimeter model. Other multimeter models may be assembled using the same basic case, but with a different front panel. Suitable graphics will typically be printed on the front surface of the panel for the particular model of multimeter to which the panel corresponds. If case member 12a is transparent in the area of recess 18, panel 16 may render the overall assembly desirably opaque in this area.

In this embodiment, for example, panel 16 defines a total of fourteen apertures (collectively indicated at 20) through which the heads of respective keys (buttons) extend. Each of the keys has a respective post that extends through a corresponding aperture (collectively 22) in top case member 12a. In presently preferred embodiments, pressing a key causes the associated post to contact the multimeter's printed circuit board (located inside the case). The posts may have a layer of conductive ink at their respective distal ends which closes a connection across terminals on the surface of the circuit board.

In this case, the set of keys is provided by a single flexible keypad 24 sandwiched between case member 12a and panel 16. The keys themselves are positioned to extend through apertures 20, whereas their respective posts extend through apertures 22. As shown, the keys may include directional navigation buttons as well as other buttons for selecting particular functions or parameters.

Referring again to FIG. 1, a plurality of jacks 26a-d are also provided for connection of respective test leads. The jacks are preferably formed by embedding conductive sockets 28a-d (FIG. 2) into top case member 12a during the molding process. Corresponding apertures 30a-d are defined in panel 16 for allowing access to the respective sockets.

A rotary selector knob 32 allows the user to select a particular multimeter function. In this embodiment, ten such functions are indicated by respective stop positions in the knob rotation. Selector knob 32 includes a shaft 34 that extends into the interior of case 12. In this regard, top case member 12a and panel 16 define respective apertures 36 and 38 for receipt of shaft 34. An elastomeric O-ring may be located around shaft 34 to inhibit moisture penetration into the case.

Figure 3:
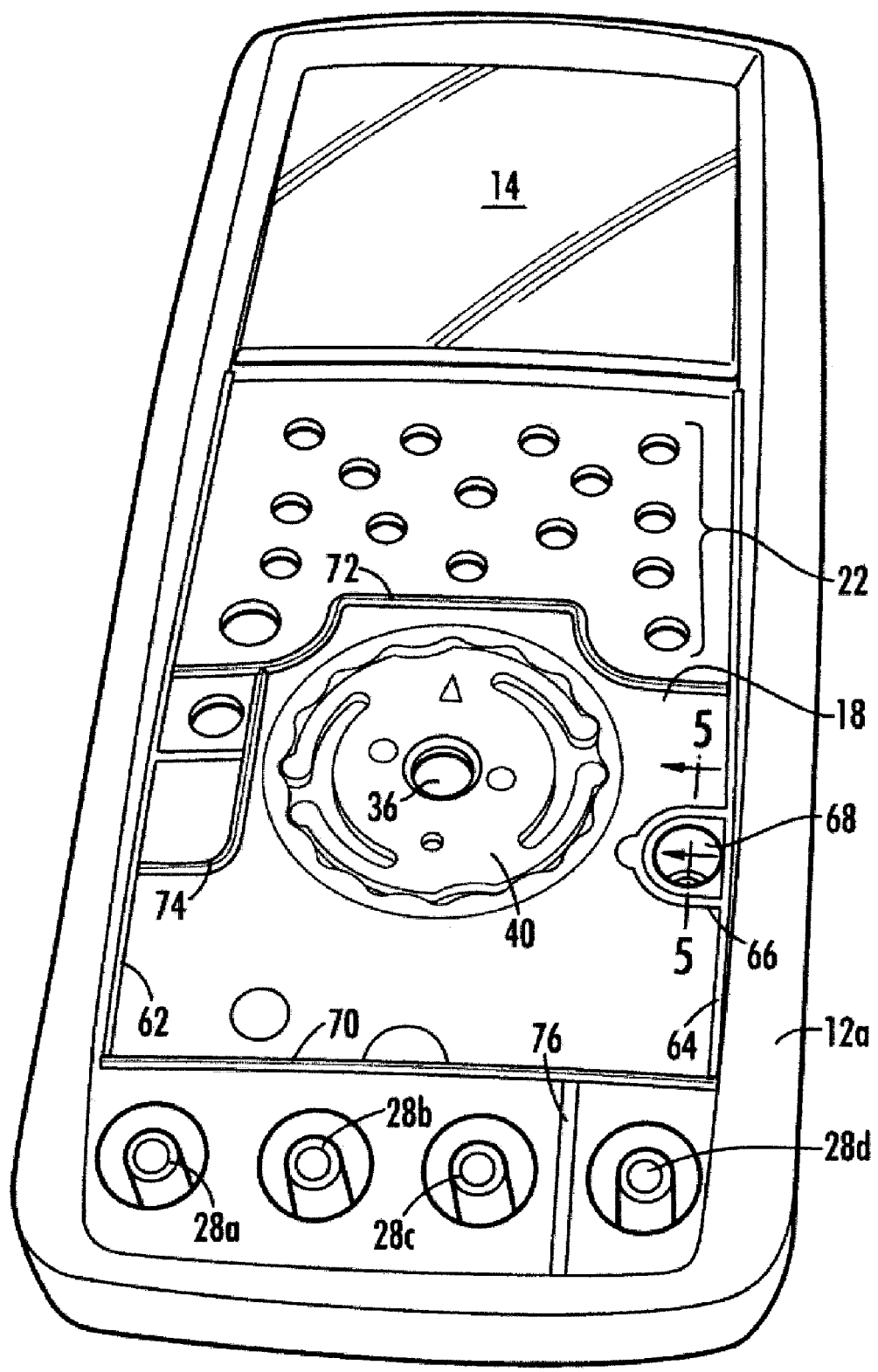
FIG. 3 is an isometric view of the top case member with front panel removed.

Shaft 34 connects selector knob 32 to a rotary switch assembly mounted to the interior circuit board. Preferably, a suitable detent mechanism 40 (FIG. 3) divides rotation of selector knob 32 into discrete increments. As a result, selector knob 32 will remain in the selected position until the user intentionally moves the knob to a new position.

Referring to FIG. 2, a stop feature is preferably provided to limit rotation of knob 32 in both clockwise and counterclockwise directions. In this embodiment, the stop feature comprises an arcuate groove 42 defined in the surface of panel 16. Groove 42 receives a protrusion located on the bottom of selector knob 32. When the protrusion engages the end faces of groove 42, further rotation is prevented.

Figure 4:
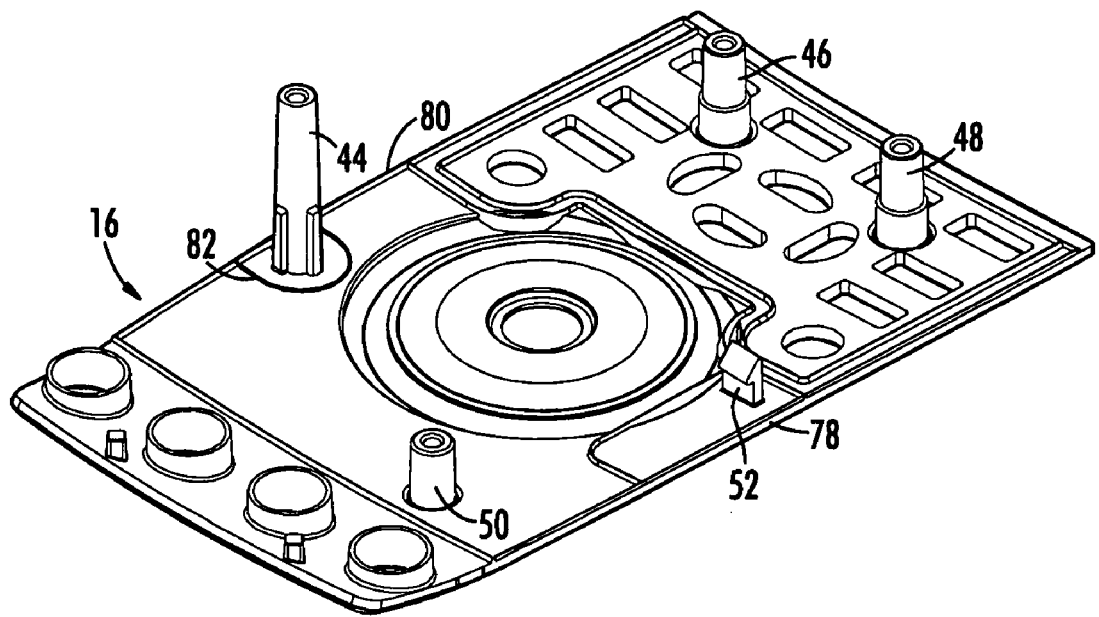
FIG. 4 is a perspective view showing the underside of the front panel illustrated in FIG. 2.

As shown in FIG. 4, one or more bosses may be provided to retain panel 16 in position when the case is assembled. In this embodiment, for example, at least four such bosses are provided (respectively designated 44, 46, 48 and 50). As known to those skilled in the art, the bosses each have a threaded hole into which a threaded fastener is inserted. Being the longest, boss 44 extends all the way through the interior of case 12 for connection to bottom case member 12b. The remaining bosses 46, 48 and 50 may secure the circuit board to top case member 12a. A snap element 52 may also be provided to engage a corresponding slot in top case member 12a, or an additional boss may be provided at this location for connection to the circuit board.

Figure 6:
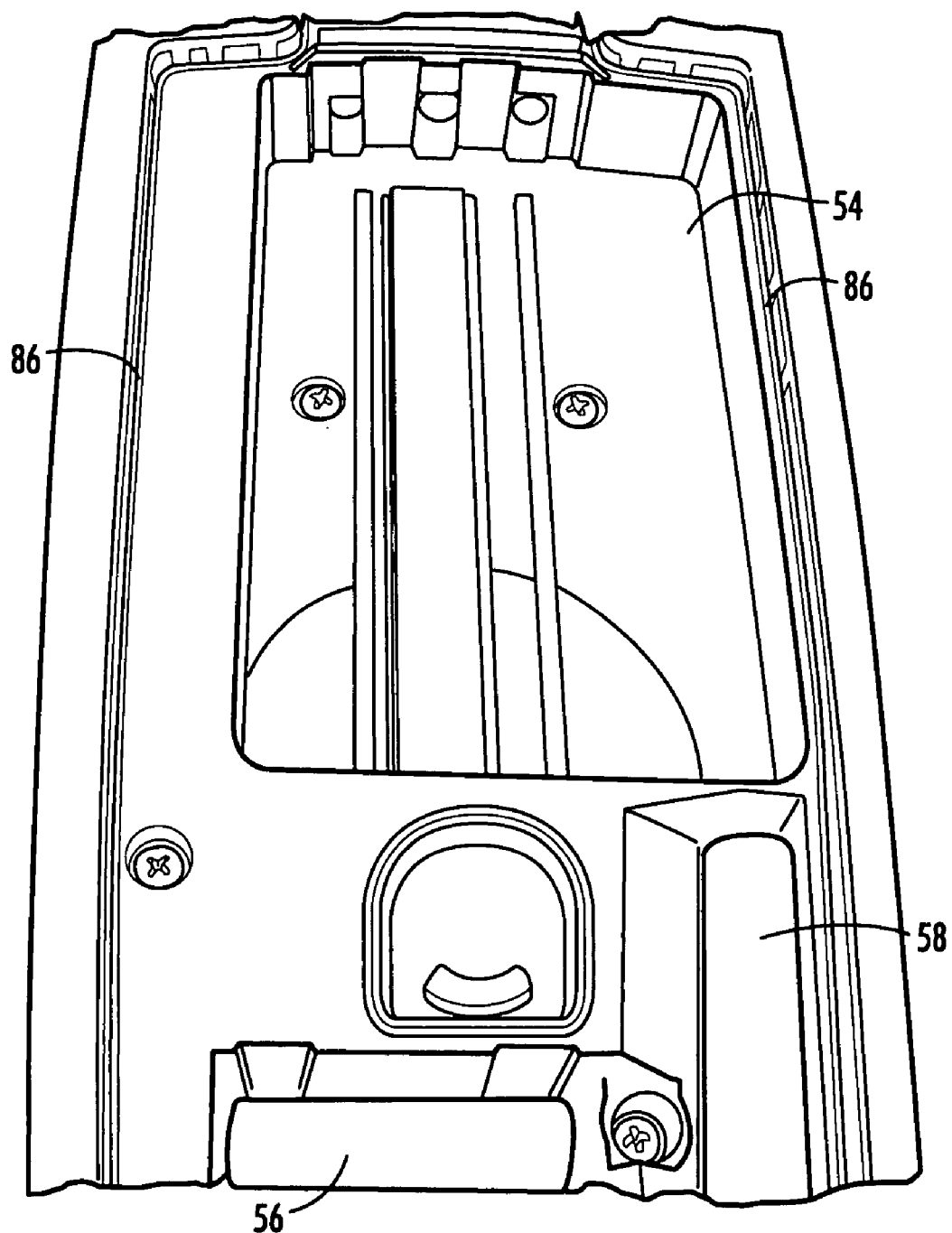
FIG. 6 is an isometric view of the bottom case member with battery door removed to show the battery compartment.

As shown in FIG. 6, the bottom of case member 12b preferably defines a battery compartment 54 for containing the batteries used to power multimeter 10. Battery compartment 54 may also allow access to fuses 56 and 58, or other internal components. Battery compartment 54 is preferably closed by a removable battery cover 60 (FIG. 2). Similar to case member 12b, battery cover 60 is preferably formed of an opaque rigid polymeric material overmolded with a softer polymeric material.

As can be seen, the housing of multimeter 10 is formed of a number of separate elements (e.g., case 12, panel 16, battery cover 60) that are joined together to form the overall housing. It is desirable to provide an effective sealing arrangement between these components to inhibit penetration of moisture or other contaminants. According to the present invention, this may be accomplished by providing grooves at selected mating locations in the rigid shell of case 12. During the overmolding process, the softer polymeric material flows into these grooves. An opposing bead, such as a pyramidal rib, is provided in the opposing part so as to align with the groove. When the parts are brought together, the bead presses into the softer polymeric material to form an effective environmental seal.

Referring again to FIG. 3, several such grooves may be defined in panel recess 18. In this embodiment, for example, panel recess 18 includes two substantially parallel grooves 62 and 64. As shown, grooves 62 and 64 extend adjacent to the respective lateral sides of panel recess 18. An additional groove 66 is arcuate and extends around an aperture 68 in semicircular fashion. When panel 16 is positioned in panel recess 18, boss 44 is received in aperture 68.

Panel recess 18 may include additional sealing features in the form of ribs 70, 72 and 74. These ribs are similar to the "crushed rib" arrangements used to seal case halves in the prior art. In this embodiment, the softer polymeric material used to produce ribs 70, 72 and 74 and to fill grooves 62, 64 and 66 is fed during the overmolding process through a flow channel 76. After cooling, the softer polymeric material will remain in the flow channel.

Figure 5:
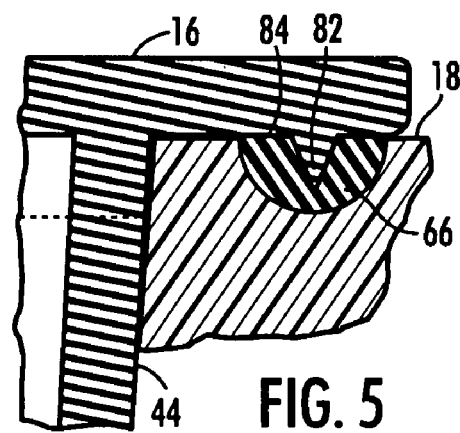
FIG. 5 is an enlarged cross-sectional view taken along line 5-5 of FIG. 3 with the front panel in position.

Referring now to FIG. 4, beads 78, 80 and 82 align with respective grooves 62, 64 and 66 when panel 16 is positioned in recess 18 during the assembly process. As a result, the beads will press into the softer polymeric material of the associated groove to provide an effective seal. This is shown clearly in FIG. 5, where bead 82 pierces the softer polymeric material 84 in groove 66.

Figure 7:
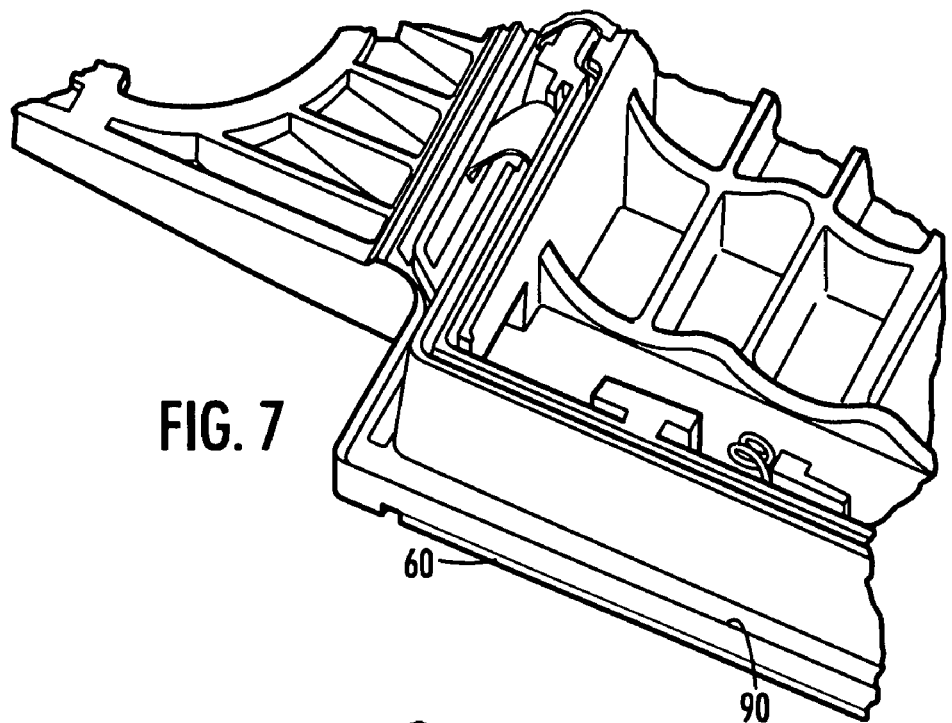
FIG. 7 is an enlarged fragmentary view of a portion of the battery door.
Figure 8:
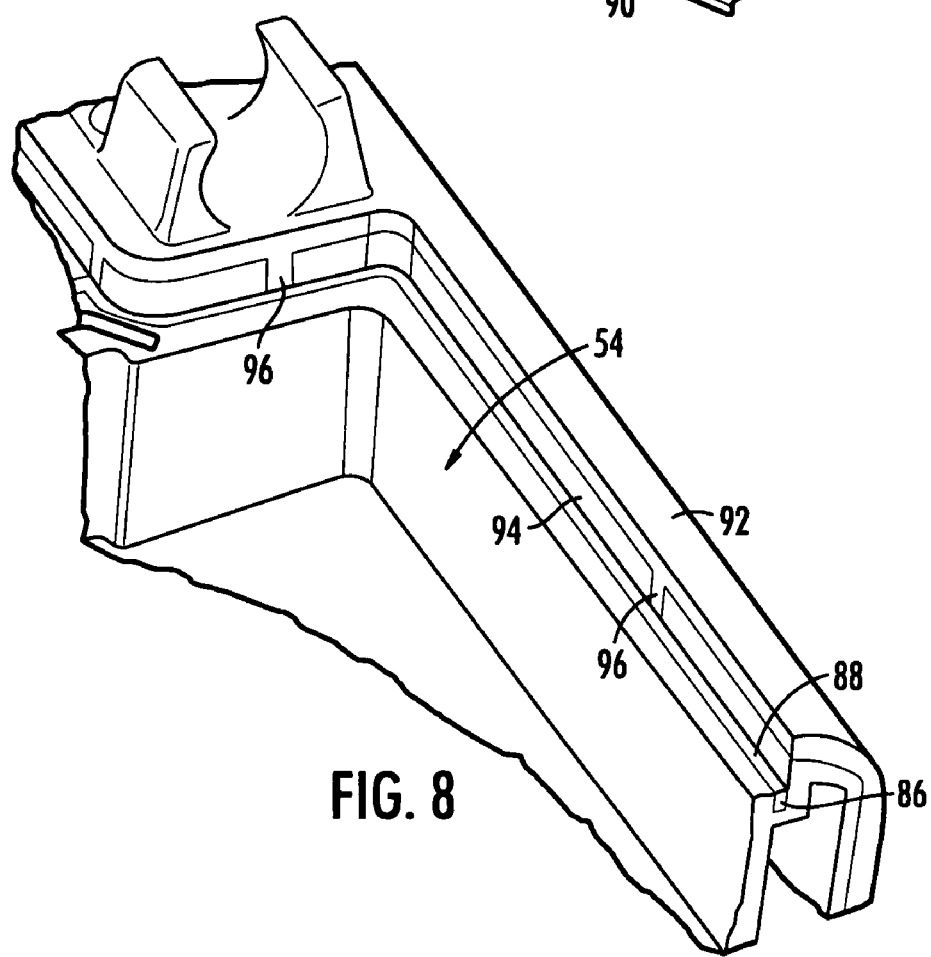
FIG. 8 is an enlarged fragmentary view of a portion of the battery compartment of the bottom case member.
Figure 9:
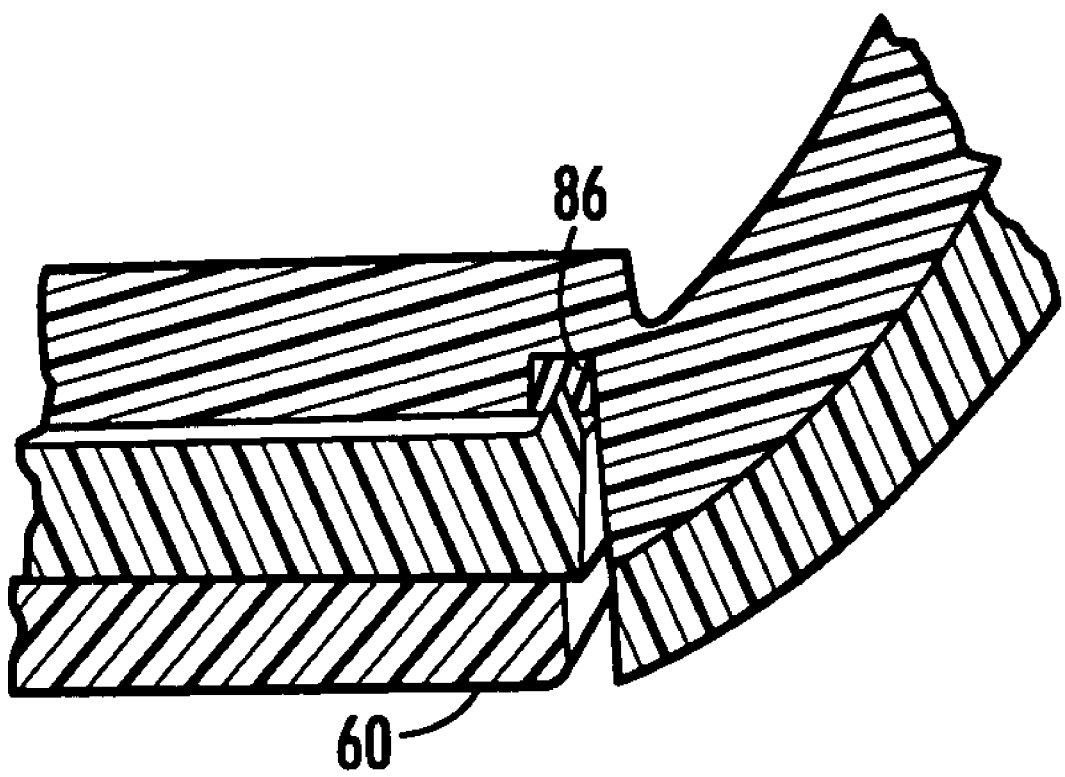
FIG. 9 is an enlarged cross sectional view showing the manner in which the battery door mates with the bottom case member in accordance with the present invention.

Referring now to FIGS. 6-9, a similar sealing arrangement is preferably provided between battery compartment 54 and battery cover 60. For example, battery compartment 54 may have a groove 86 extending around much or all of its inner periphery. Groove 86 is filled with the softer polymeric material, as indicated at 88 (FIG. 8). A pyramidal bead 90 is located on the inner side of battery cover 60 (FIG. 7). As shown in FIG. 9, bead 90 engages the overmold material located in groove 86 when battery cover 60 is closed.

FIG. 8 also clearly shows the overmold 92 located on the outside of the rigid shell 94 of case member 12b. During the overmolding process, the softer material fills groove 86 through a series of flow channels (or "gates") 96. As one skilled in the art will appreciate, the softer material remains in the gates after the overmolding process is completed.

It can thus be seen that the present invention provides an effective sealing arrangement for inhibiting ingress of moisture or other contaminants into the interior of a multimeter housing. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising:
   a housing structure including a case defining an interior cavity in which components of said multimeter are located;
   said case having a shell of rigid polymeric material defining at least one groove;
   said shell of said case being partially overmolded with a softer polymeric material to form a gripping surface on an exterior of said case and to fill said groove with said softer polymeric material;
   said housing structure further including at least one rigid panel element juxtaposed to said case, said panel element comprising an elongate bead on an inside surface thereof; and
   said groove being in alignment with said elongate bead such that said elongate bead is received in said groove and presses into said softer polymeric material to provide a seal.

2. A multimeter as set forth in claim 1, wherein said at least one rigid panel element comprises a separate front panel juxtaposed to a top portion of said case.

3. A multimeter as set forth in claim 2 wherein:
   said separate front panel defines substantially parallel first and second beads extending adjacent to respective lateral sides thereof; and
   said case defines a panel recess in a top portion thereof for receipt of said front panel, said panel recess having substantially parallel first and second grooves filled with said softer polymeric material.

4. A multimeter as set forth in claim 1, wherein said at least one rigid panel element comprises a battery compartment door.

5. A multimeter as set forth in claim 4, wherein said battery compartment door comprises a perimeter bead pressing against said softer polymeric material in a perimeter groove defined about at least a portion of a periphery of a battery compartment in said case.

6. A multimeter as set forth in claim 1, wherein said case is formed of top and bottom case members which together define said interior cavity.

7. A multimeter as set forth in claim 6, wherein said rigid polymeric material of said top case member is a transparent polymeric material.

8. A multimeter as set forth in claim 7, wherein said rigid polymeric material of said bottom case member is an opaque polymeric material.

9. A multimeter comprising:
   a housing structure including a case defining an interior cavity in which components of said multimeter are located;
   said case having a shell of rigid polymeric material defining at least one groove containing a softer polymeric material;
   said housing structure further including at least one rigid panel element juxtaposed to said case, said panel element comprising an elongate bead on an inside surface thereof;
   said groove being in alignment with said elongate bead such that said elongate bead presses into said softer polymeric material to provide a seal;
   wherein said shell of said case is partially covered by said softer polymeric material to provide an exterior gripping surface; and
   wherein said softer polymeric material of said gripping surface and said softer polymeric material in said groove are interconnected by a flow channel containing said softer polymeric material.

10. A multimeter comprising:
    a housing structure including a case defining an interior cavity in which components of said multimeter are located;
    said case having a shell of rigid polymeric material defining at least one groove containing a softer polymeric material;
    said housing structure further including at least one rigid panel element juxtaposed to said case, said panel element comprising an elongate bead on an inside surface thereof;
    said groove being in alignment with said elongate bead such that said elongate bead presses into said softer polymeric material to provide a seal;
    wherein said at least one rigid panel element comprises a separate front panel juxtaposed to a top portion of said case, said separate front panel defining substantially parallel first and second beads extending adjacent to respective lateral sides thereof;
    said case defines a panel recess in a top portion thereof for receipt of said front panel, said panel recess having substantially parallel first and second grooves filled with said softer polymeric material; and wherein said front panel includes an arcuate bead extending around a mounting boss depending from said inside surface thereof, said case defining a corresponding arcuate groove in said panel recess containing said softer polymeric material.

11. A housing structure for a hand-held electronic device, said housing structure comprising:

a plurality of separate elements joined together including a shell of rigid polymeric material at least partially covered by a softer polymeric material to provide an exterior gripping surface;

said shell defining at least one groove containing a softer polymeric material;

a second separate element of said plurality of separate elements mating with said shell and having an elongate bead on an inside surface thereof;

said groove being in alignment with said elongate bead such that said elongate bead presses into said softer polymeric material to provide a seal; and wherein said softer polymeric material of said gripping surface and said softer polymeric material in said groove are interconnected by a flow channel containing said softer polymeric material.

12. A housing structure as set forth in claim 11, wherein said second separate element comprises a front panel.

13. A housing structure as set forth in claim 11, wherein said second separate element comprises a battery compartment door.

14. A multimeter comprising:

a housing structure including a case defining an interior cavity in which components of said multimeter are located;

said case having a shell of rigid polymeric material;

said housing structure further including at least one rigid panel element juxtaposed to said case;

a sealing arrangement wherein one of said case and said panel element defines at least one groove containing a softer polymeric material and another of said case and said panel element has an elongate bead aligned with said groove, wherein said elongate bead presses into said softer polymeric material to provide a seal;

wherein said shell of said case is partially covered by said softer polymeric material to provide an exterior gripping surface; and wherein said softer polymeric material of said gripping surface and said softer polymeric material in said groove are interconnected by a flow channel containing said softer polymeric material.

15. A multimeter as set forth in claim 14, wherein said at least one rigid panel element comprises a separate front panel juxtaposed to a top portion of said case.

16. A multimeter as set forth in claim 14, wherein said at least one rigid panel element comprises a battery compartment door.

* * * * *